United States Patent [19]

Schuster et al.

[11] Patent Number: 5,066,844
[45] Date of Patent: Nov. 19, 1991

[54] SOLDERING DEVICE WITH STIRRUP ELECTRODES AND A SUCTION PIPETTE

[75] Inventors: Rudolf Schuster, Heimstetten; Josef Raschke, Gelting, both of Fed. Rep. of Germany

[73] Assignee: Siemens Aktiengesellschaft, Munich, Fed. Rep. of Germany

[21] Appl. No.: 587,793

[22] Filed: Sep. 25, 1990

[30] Foreign Application Priority Data

Sep. 29, 1989 [DE] Fed. Rep. of Germany ....... 3932651

[51] Int. Cl.⁵ .................. H05B 1/00; B23K 3/00; B08B 15/04
[52] U.S. Cl. .................. 219/85.16; 219/230; 228/20
[58] Field of Search ............... 219/85.16, 85.19, 85.22, 219/233, 85.18, 230; 228/180.1, 180.2, 44.7, 51, 55, 20

[56] References Cited

U.S. PATENT DOCUMENTS

| 4,135,630 | 1/1979 | Snyder et al. | 214/1 BS |
|---|---|---|---|
| 4,256,644 | 3/1981 | Delorme | 219/233 |
| 4,358,662 | 11/1982 | Cranor et al. | 228/20 |
| 4,552,300 | 11/1985 | Zovko et al. | 228/20 |
| 4,607,151 | 8/1986 | Kihlstrom | 219/230 |
| 4,912,743 | 3/1990 | Zeltner | 219/85.16 |
| 4,982,890 | 1/1991 | Schuster et al. | 228/44.7 |

FOREIGN PATENT DOCUMENTS

| 100229 | 2/1984 | European Pat. Off. | 219/230 |
|---|---|---|---|
| 1186417 | 10/1985 | U.S.S.R. | 219/230 |

OTHER PUBLICATIONS

*Electronic Packaging and Production*, vol. 28, No. 2, Feb. 1988. p. No. 14, "Soldering Machines take on Quad Flat Packs".

Primary Examiner—Geoffrey S. Evans
Attorney, Agent, or Firm—Hill, Van Santen, Steadman & Simpson

[57] ABSTRACT

A soldering device has two or four stirrup electrodes secured to a soldering stirrup holder and a centrally-arranged suction pipette between the stirrup electrodes for picking up, conveying and placing components onto assigned soldering locations. Sensitive mechanical and electrical parts, particularly machanical guides and electrical contacts are protected against undesired precipitation of soldering vapors that arise during the soldering process. This protection is achieved by an extraction device for solder vapors which includes an annular extraction opening between the suction pipette and the soldering stirrup holder. The extraction opening discharges into an extraction chamber arranged above the soldering stirrup holder and is in communication with at least one extraction port.

1 Claim, 1 Drawing Sheet

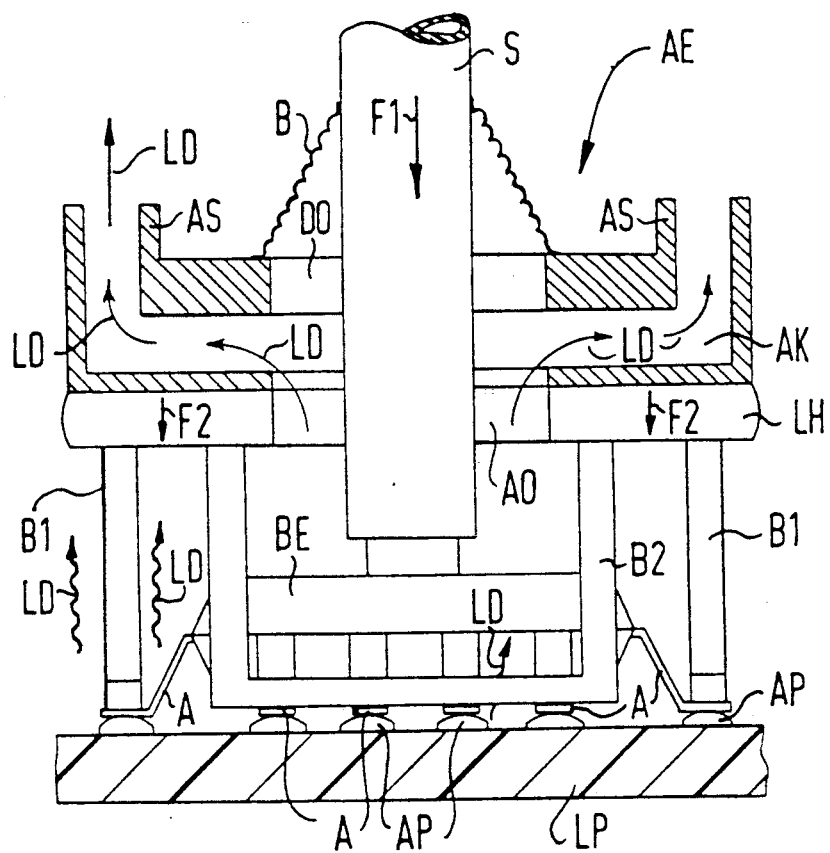

SOLDERING DEVICE WITH STIRRUP ELECTRODES AND A SUCTION PIPETTE

CROSS REFERENCE TO RELATED APPLICATION

This application is related to an application Ser. No. 444,831, filed Dec. 1, 1989, now U.S. Pat. No. 4,982,890, to an application Ser. No. 459,946, filed Jan. 2, 1990, now U.S. Pat. No. 5,016,804, to an application Ser. No. 506,922, filed Apr. 10, 1990, correctly pending, and to an application Ser. No. 07/587,746, filed Sept. 25, 1990.

BACKGROUND OF THE INVENTION

1. Field of the Invention

The present invention relates to a soldering device for soldering components onto printed circuit boards, comprising at least two stirrup electrodes secured to a soldering stirrup holder and heatable by electrical resistance heating, and comprising a suction pipette arranged centrally between the stirrup electrodes for picking up, conveying and placing the components onto a signed soldering locations.

2. Description of the Prior Art

Soldering device having two stirrup electrodes lying parallel and opposite one another or having four stirrup electrodes lying opposite one another in pairs are particularly utilized for soldering electronic components having many terminals, such as micropacks, flat packs and the like. When such a soldering device is then additionally equipped to the suction pipette arranged centrally between the stirrup electrodes, the soldering device can then be utilized for the automatic equipping of printed circuit boards with the components to be soldering thereon. When equipping in accordance with what is referred to as the pick and place principle, the combined equipping and soldering head moves over the delivery modules of the components and over the printed circuit board arranged in the equipping region, whereby the suction pipette picks up the respective component from the delivery module and places it onto the printed circuit board in the prescribed equipping position. After placement of the respective component, the soldering stirrup holder is then lowered, so that an optimally reliable contact between the working surfaces of the stirrup electrodes, the terminal legs of the component and the interconnect or, respectively, the terminal pads of the printed circuit board results before the soldering process as well as over the entire duration of the soldering process. The suction pipette remains on the component until the end of the soldering process and thereby presses the component against the soldering location on the printed circuit board with a limited force.

During the soldering process initiated by the electrical resistance heating of the stirrup electrodes, solder vapors that can contain both volatile constituents such as dilutants of the employed fluxing agent and solid constituents of the employed fluxing agents such as, for example, colophonium arise. The solder vapors that already arise before the soldering temperature is reached then precipitate on colder locations of the soldering device, whereby this precipitation can lead to a destruction or at least to a considerable deterioration, particularly in the region of the mechanical guides, in the region of bearings or articulations and in the region of electrical contacts. A manual removal of the precipitation, as is still possible given an occasional employment of the soldering device, must be excluded given utilization of the soldering device in mass production.

SUMMARY OF THE INVENTION

In a soldering device of the type initially set forth, the object of the present invention is to at least largely prevent a precipitation of soldering vapors onto sensitive parts of the device.

The above object is achieved, according to the present invention, by an extraction device for solder vapors having an annular extraction opening and which is arranged between the suction pipette and the stirrup holder.

In a soldering device constructed in accordance with the present invention, therefore, the solder vapors arising during the soldering process are suctioned off, whereby this extraction should be optimally effective and optimally uniform in the area of the entire soldering locations. Since an extraction with two or more extraction openings would lead to a mutual deterioration and to the formation of neutral zones, only a single extraction opening is provided in the extraction device constructed in accordance with the present invention, this single extraction opening being arranged above the soldering location between the suction pipette and the soldering stirrup holder and being aligned coaxially with the suction pipette. An undesired precipitation of soldering vapors onto sensitive parts of the soldering device, such as mechanical guides and electrical contacts, is thereby at least largely suppressed. A possible precipitation of the solder vapors onto the suction pipette is thereby intentionally accepted since the suction pipette can be removed at certain time intervals without particular expense and can be cleaned or replaced outside of the soldering device.

In accordance with a preferred embodiment and feature of the invention, the extraction opening discharges into an extraction chamber arranged above the soldering stirrup holder and which is provided with at least one extraction nozzle. As a result thereof, the entire extraction device is integrated into the soldering device at a central location, whereby the extraction nozzle merely has to be connected to a ventilator or the like for accelerating the extraction of the solder vapors. The upper opening of the suction pipette through the extraction chamber is then advantageously sealed. When the upper opening is sealed with an elastic bellows, then the required displacement between the suction pipette and the extraction chamber can be with particularly little expense.

BRIEF DESCRIPTION OF THE DRAWING

Other objects, features and advantages of the invention, its organization, construction and operation will be best understood from the following detailed description, taken in conjunction with the accompanying drawing, on which there is a single FIGURE which is a highly-simplified, schematic view of the structural components for illustrating the basic principle of the soldering device constructed in accordance with the present invention, whereby those parts such as power leads and the like that are not required for an understanding of the invention have been omitted.

DESCRIPTION OF THE PREFERRED EMBODIMENTS

The illustrated soldering device has four U-shaped stirrup electrodes secured to a soldering stirrup holder LH, whereby respectively two stirrup electrodes B1 and two stirrup electrodes B2 are aligned parallel to one another at a distance such that the working surfaces on the underside of the stirrup electrodes B1 and B2 form a rectangular or quadratic frame that is not closed in the corner regions. The dimensions of this frame are thereby matched to the shape and position of the terminal legs A of a component BE this is to be soldered onto the terminal pads AP of a printed circuit board LP.

The components BE are taken from a magazine or from a delivery module with a suction pipette S of an equipping head (not shown in detail on the drawing) and are placed onto the prescribed soldering location on the printed circuit board LP. The structure and operation of an equipping head equipped with a suction pipette are disclosed, for example, in U.S. Pat. No. 4,135,630, fully incorporated herein by this reference.

When the component BE is placed onto the prescribed soldering location of the printed circuit board LP, the terminal legs A come into contact with the assigned terminal pads AP. The suction pipette S is thereby additionally employed to press the component BE against the printed circuit board LP with a limited force F1 of, for example, 0.1–0.5N until the end of the soldering process. After the placement of the component BE, the soldering stirrup holder LH is then moved down to the position shown on the drawing, whereby the working surfaces of the stirrup electrodes B1 and B2 press the terminal legs A against the assigned terminal pads AP with a force F2, for example, 40 N. The actual soldering process then occurs by melting the solder of the terminal pads AP as a consequence of a corresponding electrical resistance heating of the stirrup electrodes B1 and B2.

During the heating of the working surfaces of the stirrup electrodes B1 and B2, the formation of solder vapors LD already arises before the soldering temperature is reached, the soldering vapors LD particularly containing constituents of the fluxing agent employed as a solvent and colophonium. In order to prevent an undesired precipitation of these solder vapors LD onto sensitive mechanical and electrical parts, an extraction device AE is provided and constructed between the suction pipette S and an opening of the solder stirrup holder LH to include an extraction opening AO, the extraction device AE being arranged coaxially with the suction pipette S. The extraction opening AO discharges into an extraction chamber AK arranged on the soldering stirrup holder LH and is likewise arranged coaxially with the suction pipette S and has two extraction muffs or nozzles AS lying opposite one another. For generating the required draft, the extraction nozzles AS are connected to ventilators (not shown on the drawing).

It may also be seen that the upper opening DO for receiving the suction pipette S is sealed by the extraction chamber AK with the assistance of an elastic bellows B which allows a separate lifting and lowering of the suction pipette S, on the one hand, of the soldering stirrup LH together with the extraction chamber AK, on the other hand.

As already mentioned above, the above-described extraction of soldering vapors serves the purpose of protecting sensitive electrical and/or mechanical parts. The sensitive electrical and/or mechanical parts particularly involve the contact locations of the power supply and the contact locations of the thermoelements. The sensitive mechanical parts particularly involve guides that enable the lifting and lowering of the soldering stirrup holder and the lifting and lowering of the suction pipette. Given an articulated suspension of the soldering stirrup holder, the extraction of the solder vapors also serve to protect the corresponding articulation. Such an articulated suspension of the soldering stirrup holder for guaranteeing a reliable contact between the working surfaces of the stirrup electrode, the terminal legs of the component to be soldered on and the terminal pads is illustrated in detail, for example, in the aforementioned United States patent application Ser. No. 444,831, filed Dec. 1, 1989.

Although we have described our invention by reference to particular illustrative embodiments thereof, many changes and modifications of the invention may become apparent to those skilled in the art without departing from the spirit and scope of the invention. We therefore intend to include within the patent warranted hereon all such changes and modifications as may reasonably and properly be included within the scope of our contribution to the art.

We claim:

1. A soldering device for soldering components onto printed circuitboards, comprising:
   a soldering stirrup holder;
   at least two soldering stirrups mounted spaced apart on said stirrup holder for electrical resistance heating;
   said stirrup holder comprising aperture means defining a central aperture therethrough between said soldering stirrups;
   a suction pipette extending through said central aperture for picking up, conveying and placing a component onto an assigned soldering location on a printed circuitboard; and
   vapor extraction means mounted adjacent said stirrup holder for extracting soldering vapors, and including extraction opening means defining an extraction opening communicating with said central aperture to support vapor flow away from said soldering stirrups, said vapor extraction means comprising a first plate mounted on said stirrup holder and including said extraction opening therethrough aligned with said central aperture, a second plate spaced from said first plate and defining an extraction chamber therebetween, port means defining at least one port at the peripheries of said first and second plates in communication with said extraction chamber, means defining a pipette opening through said second plate for receiving said pipette therethrough, and a flexible bellows sealing said second plate to said pipette on the side thereof opposite said extraction chamber.

* * * * *